(12) United States Patent
Mathew et al.

(10) Patent No.: US 6,404,237 B1
(45) Date of Patent: Jun. 11, 2002

(54) BOOSTED MULTIPLEXER TRANSMISSION GATE

(75) Inventors: Sanu Mathew, Hillsboro; Ram Krishnamurthy, Beaverton; Krishnamurthy Soumyanath, Portland, all of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/752,063

(22) Filed: Dec. 29, 2000

(51) Int. Cl.[7] .................... H03K 19/094; H03K 17/693; H03K 17/16

(52) U.S. Cl. .................. 326/113; 326/88; 326/106; 327/390; 327/408

(58) Field of Search ............................ 326/88, 92, 113, 326/106; 365/230.06, 185.05; 327/390, 589, 408

(56) References Cited

U.S. PATENT DOCUMENTS 6,072,354 A * 6/2000 Tachibana et al. .......... 327/390

* cited by examiner

Primary Examiner—Michael Tokar
Assistant Examiner—Daniel D. Chang
(74) Attorney, Agent, or Firm—Blakely, Sokoloff, Taylor & Zafman LLP (57) ABSTRACT

An apparatus and method for boosting a transmission gate by charging a pair of capacitors and using the coupling effect of that pair of capacitors to overdrive the gate inputs of NMOS and PMOS transistors of a transmission gate to turn on the transistors more strongly and speed the passage of data signals.

16 Claims, 5 Drawing Sheets

BOOSTED MULTIPLEXER TRANSMISSION GATE

FIELD OF THE INVENTION

The present invention is related to an apparatus and method for boosting transmission gates to speed the transmission of digital signals by transmission gates in multiplexed circuits.

BACKGROUND OF THE INVENTION

Commonly available electronic devices use transmission gates to output digital signals to other devices. It is often necessary to output a single digital signal to a node to which many devices are attached, especially in the case of multiplexers, where the outputs of many devices such as transmission gates are attached to a single node. Having so many devices attached to a single node increases the capacitive load, which in turn, increases the time required by a transmission gate to raise or lower the voltage of a node to the level at which the node is to be driven.

Prior solutions to overcome this capacitive load often entail using more powerful transmission gates, and this is often done by designing transmission gates that are physically larger. However, such prior designs for increasing the power of transmission gates have suffered the drawbacks of increased power consumption, increased delays in response time by the transmission gate, and actually further increasing the capacitive load that is sought to be overcome. Indeed, the increase in capacitive load caused by the use of more powerful transmission gates can actually defeat the benefits sought to the extent that the result of using a more powerful transmission gate is actually worse, especially where the outputs of multiple ones of such powerful transmission gates are attached to the same node, as would often occur in multiplexers. Furthermore, these drawbacks of increased power consumption and increased response time have become of ever increasing concern as desires for ever greater power conservation and circuit speed have continued to grow.

Figure 1:
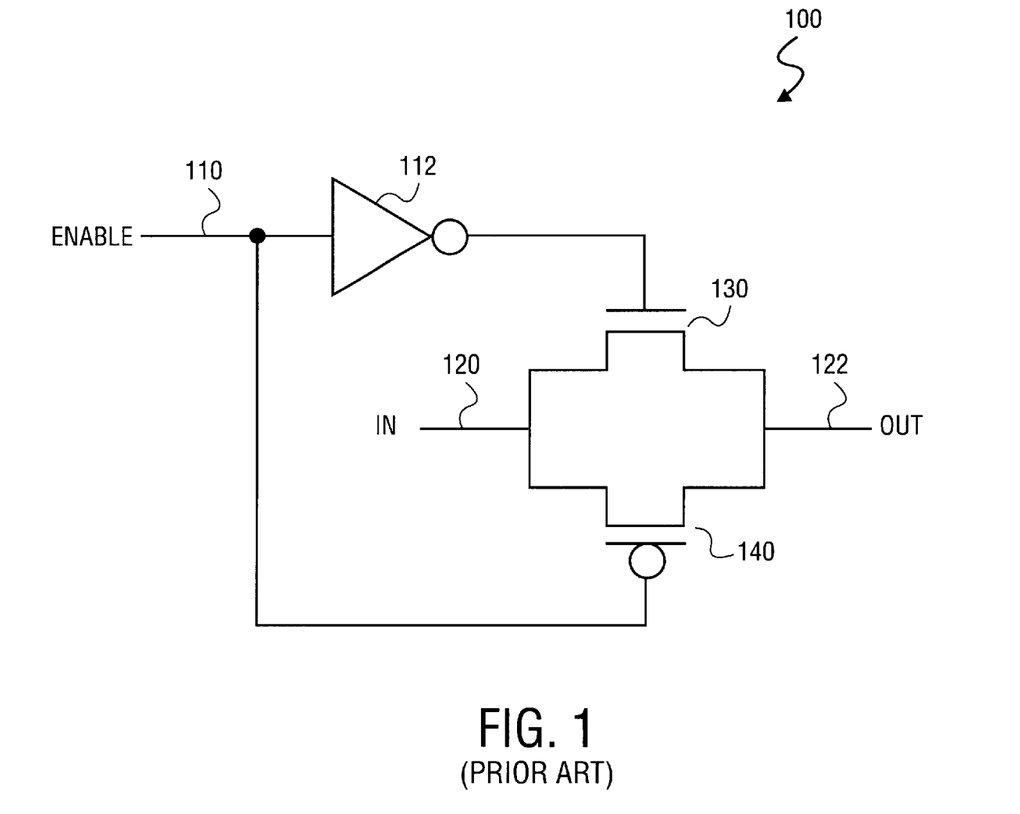
FIG. 1 is a schematic diagram of a prior art transmission gate.

FIG. 1 is a schematic diagram of a prior art transmission gate. Circuit 100 is comprised of enable input 110, inverter 112, data input 120, data output 122, NMOS transistor 130, and PMOS transistor 140. Circuit 100 is designed to allow signals to pass through from data input 120 to data output 122 in response to enable input 110 being driven low, i.e., to 0. PMOS transistor 140 receives enable input 110, directly, and allows signals to pass from data input 120 to data output 122 in response to enable input 110 being driven low, i.e., being driven to closer to 0 volts than to VCC. Correspondingly, NMOS transistor 130 receives an inverted form of enable input 110, indirectly, through inverter 112, and allows signals to pass from data input 120 to data output 122 also in response to enable input 110 being driven low. Delays are incurred arising from the time required for transistors 130 and 140 to respond to changes between high and low of enable input 110, and further delays are incurred if circuit 100 is used to pass a signal from data input 120 to a data output 122 that is connected to many other devices, as would commonly occur where circuit 100 is part of a multiplexer, or to a data output 122 that is connected to a lengthy transmission line.

BRIEF DESCRIPTION OF THE DRAWINGS

The objects, features, and advantages of the present invention will be apparent to one skilled in the art in view of the following detailed description in which.

DETAILED DESCRIPTION

In the following description, for purposes of explanation, numerous details are set forth in order to provide a thorough understanding of the present invention. However, it will be apparent to one skilled in the art that these specific details are not required in order to practice the present invention.

The present invention concerns the boosting of control signals to transistors of a transmission gate, i.e., the present invention concerns the boosting of control signals to transistors used in controlling the transmission of signals between devices. Such a transmission gate could be used in multiplexer and/or demultiplexer circuits where large numbers of inputs and/or outputs of transmission gates are connected together. However, as those skilled in the art will appreciate, the present invention may also be used singly or in parallel to speed the transmission of one or more signals over lengthy distances.

Figure 2A:
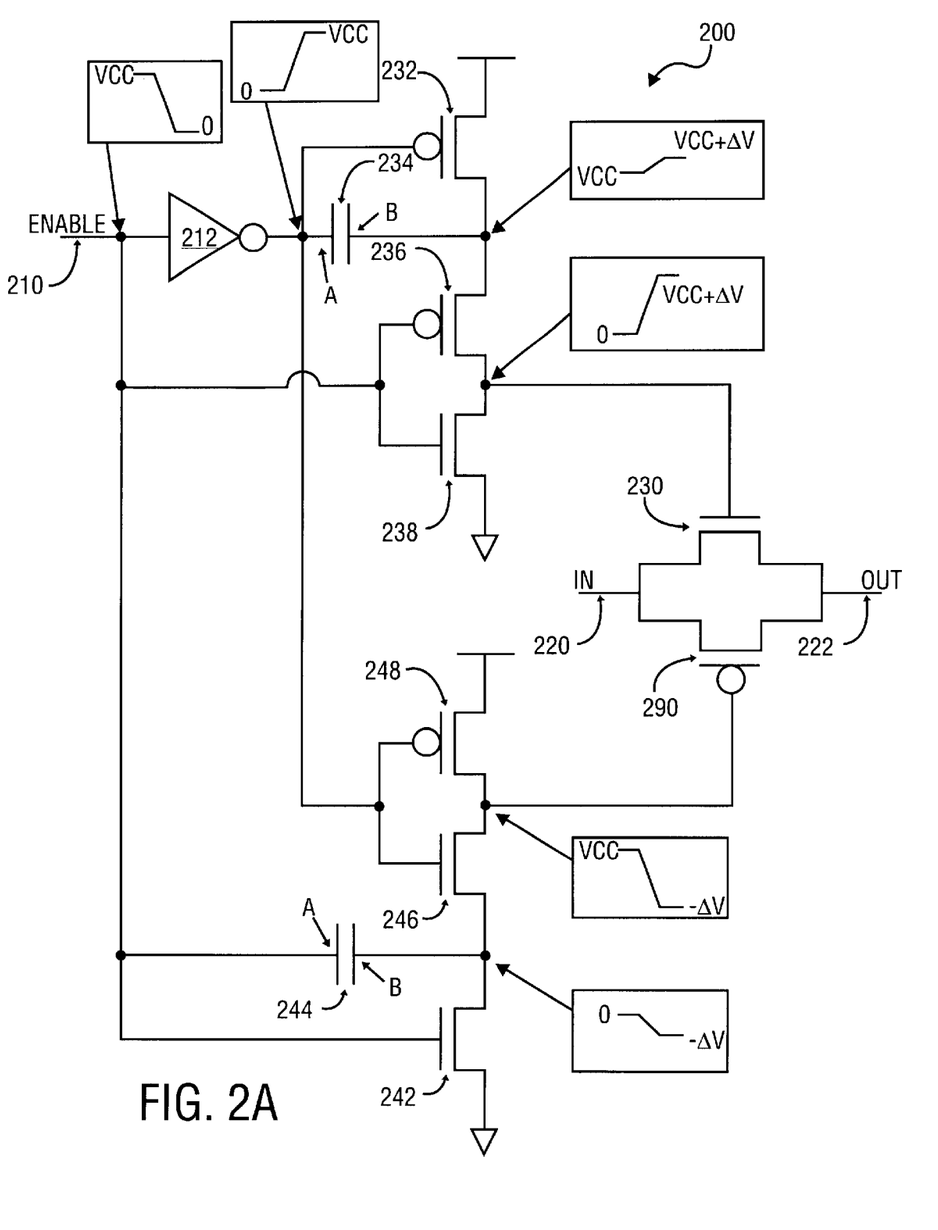
FIGS. 2a, 2b and 2c are schematic views of one embodiment of a transmission gate in accordance with the present invention, illustrating different phases of normal operation.
Figure 2B:
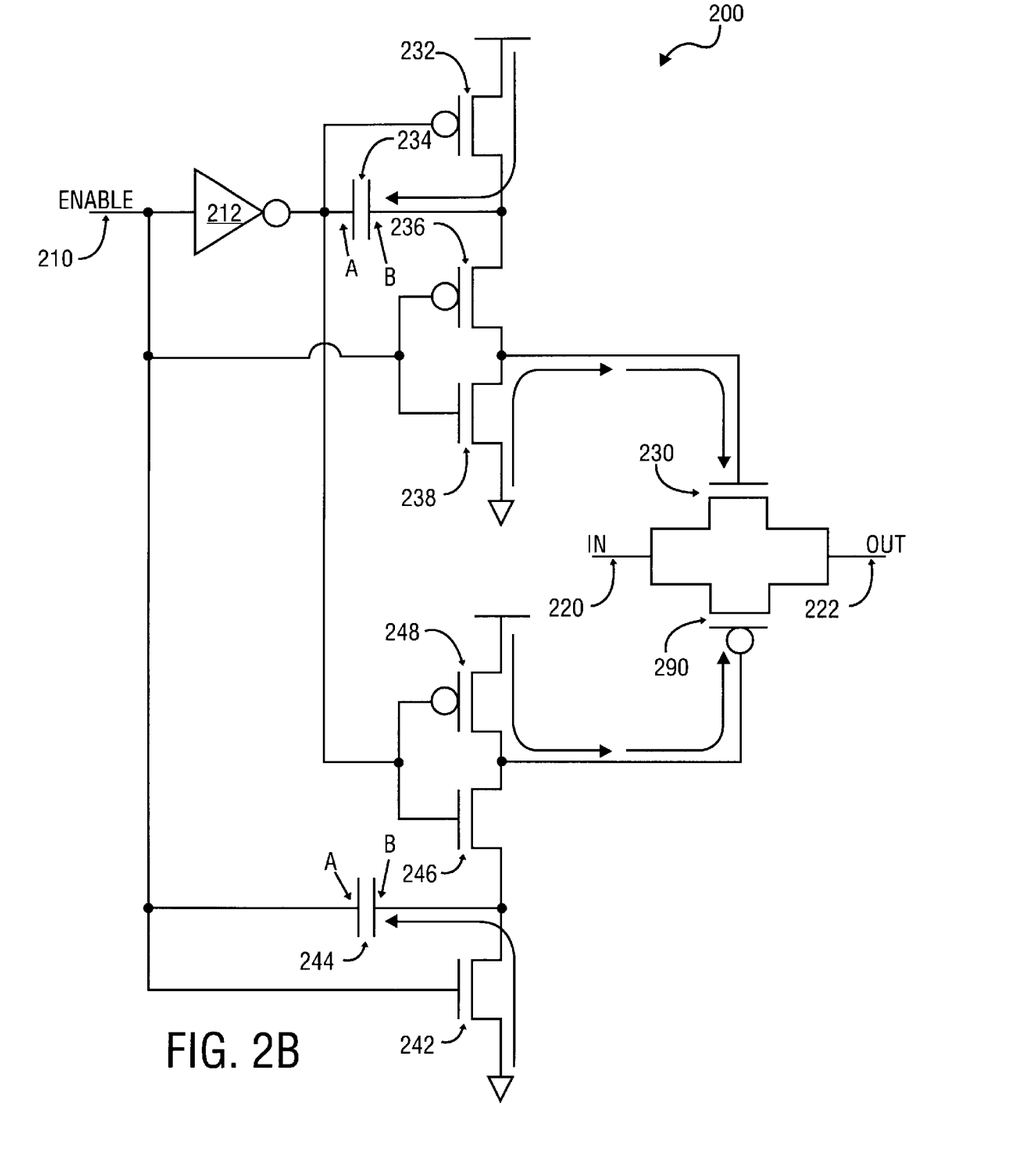
Figure 2C:
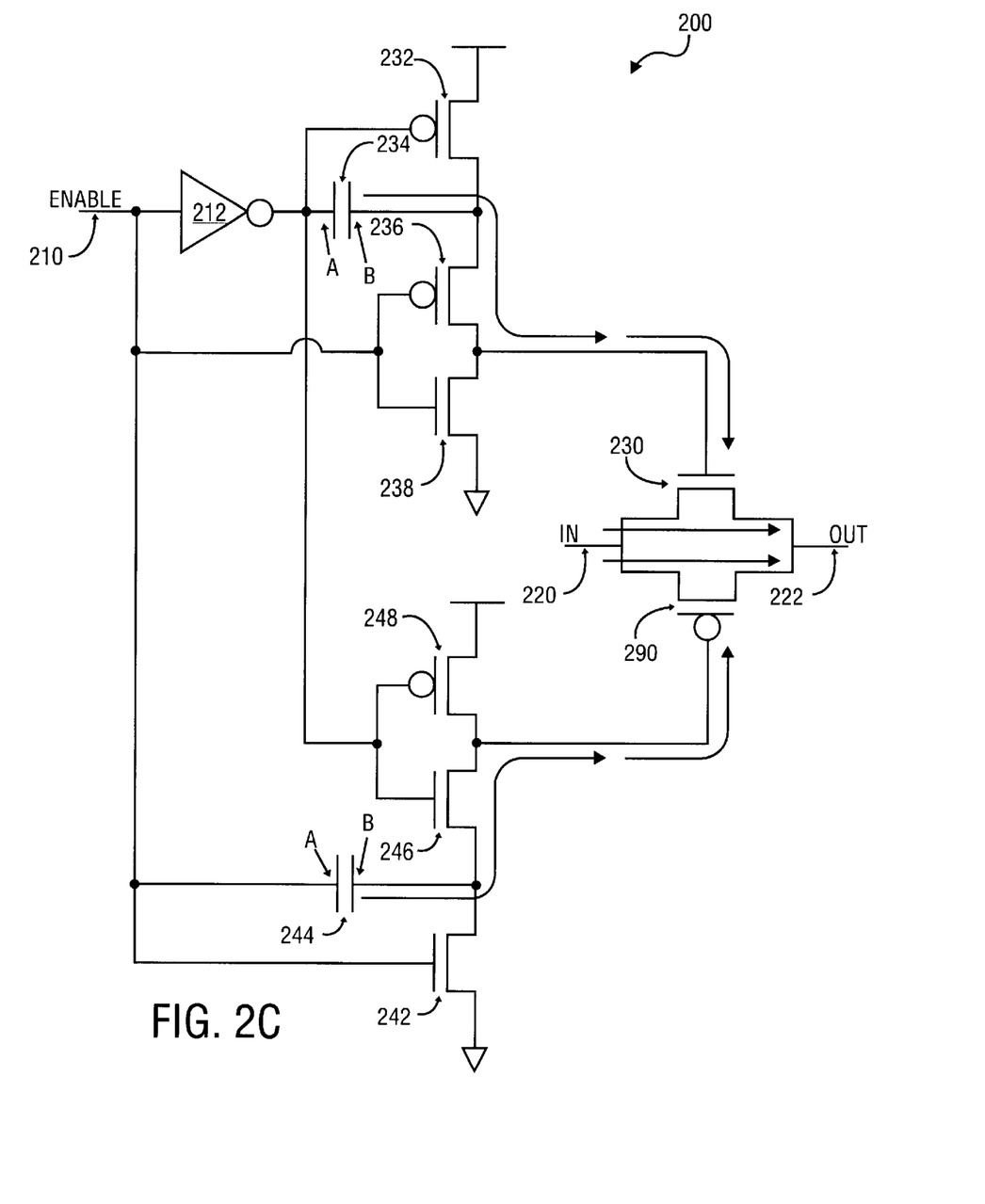

FIGS. 2a, 2b and 2c are schematic diagrams of one embodiment of a boosted transmission gate according to the teachings of the present invention. Circuit 200 is comprised of enable input 210; inverter 212; capacitors 234 and 244; NMOS transistors 230, 238, 242 and 246; PMOS transistors 232, 236, 240 and 248; data input 220 and data output 222. Transistors 230 and 240 of circuit 200 controllably allow data signals to pass from data input 220 to data output 222 in response to control signals received at enable input 210 and boosted through transistors 232, 236, 238, 242, 246 and 248, and capacitors 234 and 244. Specifically, in this embodiment, data signals are allowed to pass from data input 220 to data output 222 (i.e., circuit 200 is "on") when a low signal is received at enable input 210 (i.e., when enable input 210 is driven towards 0 volts), and data signals are not allowed to pass (i.e., circuit 200 is "off") when a high signal is received at enable input 210 (i.e., when enable input 210 is drive towards VCC).

Inverter 212 directly receives control signals from enable input 210, and creates inverted control signals. Capacitor 244, NMOS transistors 238 and 242, and PMOS transistor 236 receive the control signals directly from enable input 210, while capacitor 234, NMOS transistor 246, and PMOS transistors 232 and 248 receive the inverted control signals from inverter 212. In turn, NMOS transistor 230 is controlled by transistors 236 and 238, and FMOS transistor 240 is controlled by transistors 246 and 248.

In the normal operation of circuit 200, the gate inputs of transistors 230 and 240 are overdriven with a boosted signal to cause them to be turned on more strongly and to speed the passage of data signals from data input 220 to data output 222. This increased switching speed mitigates the increased delay incurred when the capacitive load encountered at data output 222 is increased as a result of being connected to numerous other devices (not shown) or as a result of being connected to a lengthy transmission line (also not shown) . This overdriving of the gate inputs of transistors 230 and 240 is achieved through the charging and discharging of capacitors 234 and 244, respectively.

FIG. 2b illustrates the condition of various transistors of circuit 200 when circuit 200 is off. Arrows indicate the flow of signals permitted by transistors 232, 238, 242 and 248 being turned on. As earlier described, in this embodiment, circuit 200 is off when enable input 210 is driven by a high signal. The gate inputs of transistors 236 and 238 receive this high signal, causing PMOS transistor 236 to turn off and NMOS transistor 238 to turn on, thereby causing the gate input of NMOS transistor 230 to be driven low through NMOS transistor 238 and causing NMOS transistor 230 to be in an off state. While this is occurring, node A of capacitor 234 and the gate input of PMOS transistor 232 receive the low signal generated by inverter 212 from the high signal from enable input 210, causing PMOS transistor 232 to turn on, thereby causing node B of capacitor 234 to be driven high. The low signal to node A and the high signal to node B of capacitor 234 charges capacitor 234.

While a high signal is received on enable input 210, PMOS transistor 240 is similarly caused to be in an off state in a manner corresponding to NMOS transistor 230. The high signal received by the gate inputs of transistors 236 and 238 is inverted by inverter 212 and is received as a low signal by the gate inputs of transistors 246 and 248. In a manner corresponding to transistors 236 and 238, NMOS transistor 246 is caused to turn off, while PMOS transistor 248 is caused to turn on, thereby causing the gate input of PMOS transistor 240 to be driven high through PMOS transistor 248 and causing PMOS transistor 240 to be in an off state. While this is occurring, and in a manner corresponding to capacitor 234 and PMOS transistor 232, node A of capacitor 244 and the gate input of NMOS transistor 242 receive the high signal from enable input 210, causing NMOS transistor 242 to turn on, thereby causing node B of capacitor 242 to be driven low. The high signal to node A and the low signal to node B of capacitor 244 charges capacitor 244.

FIG. 2c illustrates the condition of various transistors of circuit 200 when circuit 200 is on, and FIG. 2a illustrates the transition of voltages at various points that occurs when circuit 200 changes from an off state to an on state. In FIG. 2c, arrows indicate the flow of signals permitted by transistors 230, 236, 240 and 246 being turned on. When the signal received at enable input 210 transitions from a high to a low state, transistors 236 and 238 change states, resulting in NMOS transistor 238 turning off and PMOS transistor 236 turning on. At the same time, inverter 212 inverts the transitioning signal received at enable input 210, providing a transition from a low to a high state to node A of capacitor 234 and to the gate input of PMOS transistor 232, thereby causing PMOS transistor 232 to change states resulting in PMOS transistor 232 turning off. The turning off of PMOS transistor 232 and the turning on of PMOS transistor 236 serve to connect node B of capacitor 234 to the gate input of NMOS transistor 230. The charge previously stored within capacitor 234 while circuit 200 was off, the rising transition on node A of capacitor 234 from 0 volts to VCC, and the coupling action of capacitor 234 all serve to bootstrap node B from VCC to a voltage of VCC+ΔV. As those skilled in the art will understand, this "bootstrapping" occurs as a result of capacitor 234 having been caused to earlier store a charge with 0 volts at its node A and VCC at its node B, forming a differential in voltage of ΔV across the capacitor, between nodes A and B. This differential in voltage remains as node A is transitioned from 0 to VCC, with the result that the differential is added to the voltage at node A, and a voltage of VCC+ΔV at node B is the result. Through PMOS transistor 236, the gate input of NMOS transistor 230 is supplied with this overdrive voltage of VCC+ΔV, causing NMOS transistor 230 to be turned on more strongly, thereby speeding the propagation of data signals from data input 220 to data output 222.

While the signal received at enable input 210 transitions from high to low, PMOS transistor 240 is similarly caused to transition from an off state to an on state in a manner corresponding to NMOS transistor 230. Transistors 246 and 248, like transistors 236 and 238, change states in response to the transition at enable input 210, with PMOS transistor 248 turning off and NMOS transistor 246 turning on, although transistors 246 and 248 actually receive an inverted form of this transition through inverter 212. At the same time, the high to low transition received at enable input 210 is directly received at node A of capacitor 244 and the gate input of NMOS transistor 242, thereby causing NMOS transistor 242 to change states resulting in NMOS transistor 242 turning off. In a manner corresponding to capacitor 234, the turning off of NMOS transistor 242 and the turning on of NMOS transistor 246 serve to connect node B of capacitor 244 to the gate input of PMOS transistor 240. The charge previously stored within capacitor 244 while circuit 200 was off, the falling transition on node A of capacitor 244 from VCC to 0 volts, and the coupling action of capacitor 244 all serve to bootstrap node B from 0 to a voltage of −ΔV. Through NMOS transistor 246, the gate input of PMOS transistor 240 is supplied with this negative overdrive voltage of −ΔV, causing PMOS transistor 240 to be turned on more strongly, thereby speeding the propagation of data signals from data input 200 to data output 222.

Figure 3:
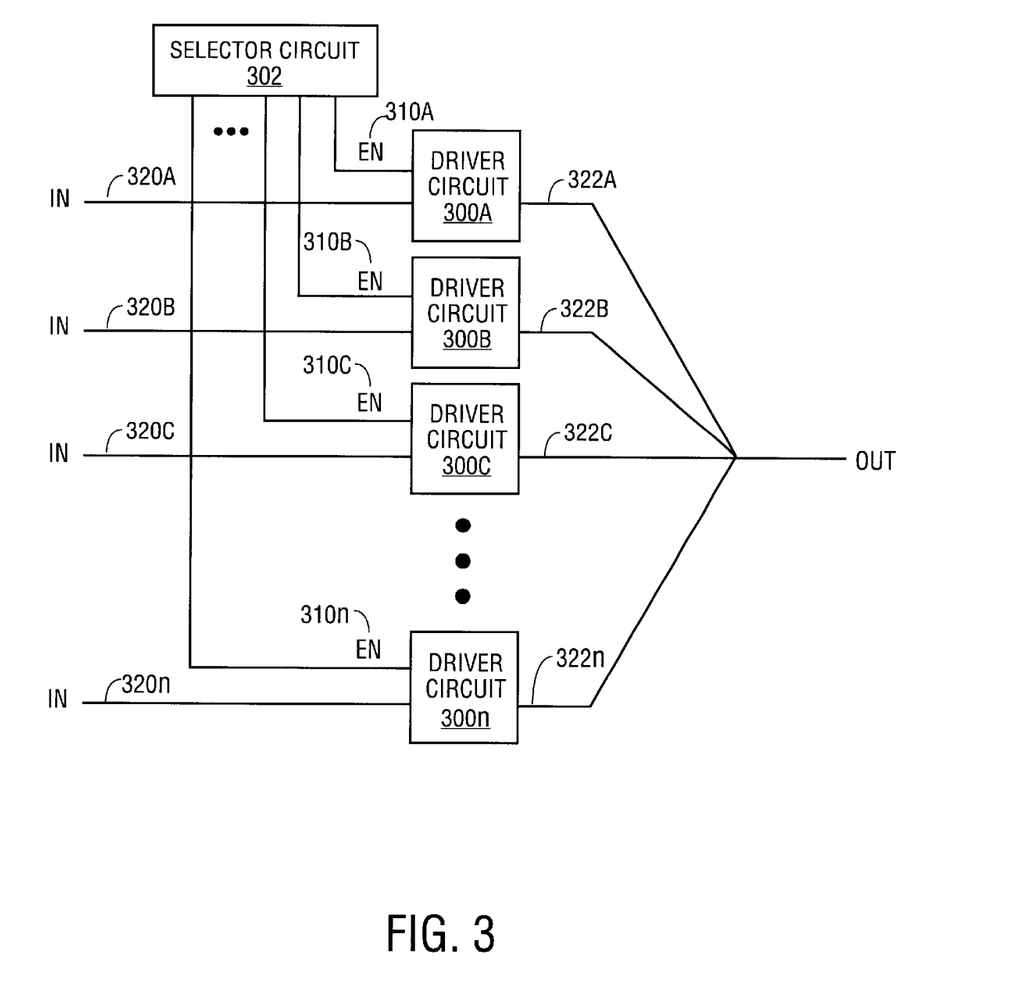
FIG. 3 is a schematic view of another embodiment of the present invention.

FIG. 3 is a schematic view of a multiplexer circuit embodying the present invention. A plurality of circuits 300a through 300n are shown incorporated into a multiplexer device. Each of circuits 300a through 300n correspond generally to circuit 200, as earlier described. Circuits 300a through 300n have enable inputs 310a through 310n that correspond to enable input 210 of circuit 200 of FIG. 2, as well as corresponding data inputs 320a through 320n and corresponding data outputs 322a through 322n. Enable inputs 310a through 310n are driven by selector circuit 302, which sends a signal to one of circuits 300a through 300n causing signals on one of data inputs 320a through 320n to be allowed to pass through to a corresponding one of outputs 322a through 322n. Outputs 322a through 322n are coupled together, forming the multiplexed output of the multiplexer device. Within each of circuits 300a through 300n, the gates of a pair of transistors (specifically one NMOS transistor and one PMOS transistor, neither of which are shown) that correspond to NMOS transistor 230 and PMOS transistor 240, respectively, of circuit 200 are overdriven to increase the speed with which the pair of transistors transition from an off state to an on state.

The invention has been described in conjunction with the preferred embodiment. It is evident that numerous alternatives, modifications, variations and uses will be apparent to those skilled in the art in light of the foregoing description. It will be understood by those skilled in the art, that the present invention may be practiced in support of other combinations of functions in a computer system.

The example embodiments of the present invention are described in the context of a circuit acting to controllably allow the passage of signals in response to an enable signal with a low active state, such that a low enable signal is meant to cause the passage of a data signal, while a high enable signals is meant to disallow such passage. However, as those skilled in the art will appreciate, the present invention may be practiced with an enable signal with a high active state, bringing about the reverse functionality. Furthermore, the present invention may be practiced using a combination of transistors and/or inverters causing the inversion of data signals, as well as their passage.

What is claimed is:

1. An apparatus for boosting a transmission gate, comprising:

a first capacitor having a first node and a second node;

a first switching device acting in response to a control signal to selectively couple the second node of the first capacitor with a gate input of a first transistor of the transmission gate;

a second capacitor having a first node and a second node;

a second switching device acting in response to the control signal to selectively couple the second node of the capacitor with a gate input of a second transistor of the transmission gate;

a third switching device acting in response to the control signal to selectively couple the second node of the first capacitor to a voltage supply to charge the first capacitor; and a fourth switching device acting in response to the control signal to selectively couple the second node of the second capacitor to a voltage supply to charge the second capacitor.

2. The apparatus of claim 1, wherein:

the first node of the second capacitor is coupled to the control signal, and through capacitive coupling, the second node of the second capacitor provides a boosted form of the control signal to the gate input of the first transistor of the transmission gate through the first switching device; and the first node of the first capacitor is coupled to an inverted form of the control signal, and through capacitive coupling, the second node of the first capacitor provides a boosted form of the control signal to the gate input of the second transistor of the transmission gate through the second switching device.

3. The apparatus of claim 2 further comprising:

a fifth switching device acting in response to the control signal to selectively couple the gate input of the first transistor of the transmission gate to a voltage supply to turn the first transistor of the transmission gate off; and a sixth switching device acting in response to the control signal to selectively couple the gate input of the second transistor of the transmission gate to a voltage supply to turn the second transistor of the transmission gate off.

4. The apparatus of claim 3, wherein the first, second, third, fourth, fifth and sixth switching devices are transistors.

5. The apparatus of claim 1, wherein the voltage supply to which second node of the second capacitor is selectively coupled by the fourth switching device is ground.

6. The apparatus of claim 3, wherein the voltage supply to which the gate input of the first transistor of the transmission gate is selectively coupled by the fifth switching device is ground.

7. A boosted transmission gate, comprising:

a first NMOS transistor for selectively allowing the passage of data from a data input of the transmission gate to a data output of the transmission gate, and having a gate input;

a first PMOS transistor for selectively allowing the passage of data from the data input of the transmission gate to the data output of the transmission gate, and having a gate input;

a first capacitor having a first node and a second node;

a second capacitor having a first node and a second node;

a first switching device acting in response to a control signal to selectively couple the gate input of the NMOS transistor of the transmission gate to the second node of the first capacitor;

a second switching device acting in response to the control signal to selectively couple the gate input of the PMOS transistor of the transmission gate to the second node of the second capacitor;

a third switching device acting in response to the control signal to selectively couple the second node of the first capacitor to a voltage supply to charge the first capacitor; and a fourth switching device acting in response to the control signal to selectively couple the second node of the second capacitor to a voltage supply to charge the second capacitor.

8. The apparatus of claim 7, wherein:

the first node of the second capacitor is coupled to the control signal, and through capacitive coupling, the second node of the second capacitor provides a boosted form of the control signal to the gate input of the NMOS transistor of the transmission gate through the first switching device; and the first node of the first capacitor is coupled to an inverted form of the control signal, and through capacitive coupling, the second node of the first capacitor provides a boosted form of the control signal to the gate input of the PMOS transistor of the transmission gate through the second switching device.

9. The apparatus of claim 8, further comprising:

a fifth switching device acting in response to the control signal to selectively couple the gate input of the NMOS transistor of the transmission gate to ground to turn the first transistor of the transmission gate off; and a sixth switching device acting in response to the control signal to selectively couple the gate input of the PMOS transistor of the transmission gate to a voltage supply higher than ground to turn the second transistor of the transmission gate off.

10. The apparatus of claim 7, wherein the first, second, third and fourth switching devices are transistors.

11. The apparatus of claim 10, wherein:

the first transistor is a PMOS transistor receiving the control signal;

the second transistor is a NMOS transistor receiving a form of the control signal that is inverted from that which the first transistor receives;

the third transistor is a PMOS transistor receiving the inverted form of the control signal; and the fourth transistor is a NMOS receiving the control signal.

12. The apparatus of claim 9, wherein the fifth and sixth switching devices are transistors.

13. The apparatus of claim 12, wherein:

the fifth transistor is a NMOS transistor receiving the control signal; and the sixth transistor is a PMOS transistor receiving a form of the control signal that is inverted from that which the fifth transistor receives.

14. A method of boosting a transmission gate, comprising:

coupling a control signal used to turn the transmission gate on and off to an inverter;

coupling the inverted form of the control signal provided by the inverter to the first node of a first capacitor;

coupling the a non-inverted form of the control signal to the first node of a second capacitor;

charging the first capacitor and the second capacitor while the transmission gate is turned off;

turning on a first transistor of a transmission gate by changing the inverted form of the control signal while also coupling the second node of the first capacitor to a gate input of the first transistor of the transmission gate through a first switching device to use the coupling effect of the first capacitor to overdrive the gate input of the first transistor; and turning on a second transistor of a transmission gate by changing the non-inverted form of the control signal while also coupling the second node of the second capacitor to a gate input of the second transistor of the transmission gate through a second switching device to use the coupling effect of the second capacitor to overdrive the gate input of the second transistor.

15. The method of claim 14, wherein the first capacitor is charged by coupling the second node of the first capacitor to a power supply through a third switching device, and wherein the second capacitor is charged by coupling the second node of the second capacitor to a power supply through a fourth switching device.

16. The method of claim 14, further comprising turning off the first transistor of the transmission gate by coupling the gate input of the first transistor of the transmission gate to a power supply, and turning off the second transistor of the transmission gate by coupling the gate input of the second transistor of the transmission gate to a power supply.

* * * * *

UNITED STATES PATENT AND TRADEMARK OFFICE
CERTIFICATE OF CORRECTION

PATENT NO. : 6,404,237 B1
DATED : June 11, 2002
INVENTOR(S) : Mathew et al.

It is certified that error appears in the above-identified patent and that said Letters Patent is hereby corrected as shown below:

Column 2,
Line 51, delete "FMOS transister 240" and insert -- PMOS transistor 240 --.

Signed and Sealed this

Fifth Day of August, 2003

JAMES E. ROGAN
*Director of the United States Patent and Trademark Office*